United States Patent [19]

Hundal et al.

[11] Patent Number: 4,786,479
[45] Date of Patent: Nov. 22, 1988

[54] APPARATUS FOR DENDRITIC WEB GROWTH SYSTEMS

[75] Inventors: Rolv Hundal, Greensburg; Raymond G. Seidensticker, Forest Hills; James P. McHugh, Wilkins Township, Allegheny County, all of Pa.

[73] Assignee: The United States of America as represented by the United States Department of Energy, Washington, D.C.

[21] Appl. No.: 92,791

[22] Filed: Sep. 2, 1987

[51] Int. Cl.$^4$ .................. C30B 35/00; C30B 29/60; C30B 29/06; C30B 15/34

[52] U.S. Cl. ............................ 422/248; 422/245; 422/249; 156/620.1; 156/620.4; 156/620.71; 156/DIG. 64; 156/DIG. 88

[58] Field of Search ............ 422/245, 248, 249; 156/620.1, 620.4, 620.71, DIG. 64, DIG. 88

[56] References Cited

U.S. PATENT DOCUMENTS

| | | | |
|---|---|---|---|
| 3,093,520 | 6/1963 | John et al. ........................ | 156/620.1 |
| 3,265,469 | 8/1966 | Hall ................................. | 422/249 |
| 3,953,174 | 4/1976 | LaBelle, Jr. ................ | 156/DIG. 88 |
| 4,116,641 | 9/1978 | Ciszek ............................. | 422/249 |
| 4,184,907 | 1/1980 | Yates ............................. | 156/620.1 |
| 4,325,917 | 4/1982 | Pelts et al. ....................... | 422/249 |

OTHER PUBLICATIONS

Seidensticker and Hopkins, "Silicon Ribbon Growth by the Dendritic Web Process," Journal of Crystal Growth 50 (1980), 221-235.

Barrett, Meyers, Hamilton and Bennett, "Growth of Wide, Flat Crystals of Silicon Web," Journal of the Electrotechnical Society (1971), 952-57.

Primary Examiner—Gary P. Straub

[57] ABSTRACT

A method and apparatus for growing dendritic web crystals at increased growth rates is disclosed in which a sublid is used to maintain a sufficiently hot silicon melt surface temperature to insure stable web growth, while simultaneously permitting more efficient heat transfer from the growing dendritic web to the cooler susceptor lid.

17 Claims, 5 Drawing Sheets

APPARATUS FOR DENDRITIC WEB GROWTH SYSTEMS

FIELD OF THE INVENTION

The present invention relates in general to an apparatus for growing dendritic web crystals, and specifically to an apparatus that permits increased growth speed of dendritic web crystals compared with prior systems.

BACKGROUND OF THE INVENTION

Growth speed is one of the two critical parameters affecting the production rate of silicon dendritic web crystals; the other parameter is the ribbon width. Larger production rates than are currently available are required to make the web process commercially viable. Although growth system lid designs have been developed that produce web crystals exceeding 6 cm in width, the growth speed has remained essentially constant, or has even decreased, especially in the larger systems necessary to accommodate continuous melt replenishment and wide web growth.

There is no particular speed at which a dendritic web crystal may be grown. With a given growth apparatus, faster growth speeds result in thinner webs and slower speeds result in thicker ojnes at constant web widths. Web width is defined as the distance between dendrites, including the dendrites, whereas web thickness is the distance between opposing faces of the web. To permit a comparison of different growth system, a "characteristic growth speed"—usually the speed that results in a 150 micrometer thick ribbon (the so-called "V(150)"),—is defined. With current growth system designs used on a web growth pilot line, the achievable V(150) is approximately 1.3 cm/min. This allows a crystal web of about 100 micrometers thickness to be grown at a speed of 1.6 cm/min under optimum conditions and more generally at a speed of 1.3 to 1.4 cm/min.

It has been estimated that in order to establish the commercial viability for the dendritic web growth process, increased production rates are required. Increasing the width of the web beyond the current maximum of 6 or 7 cm in an effort to increase production seems to be a difficult task at present and accordingly emphasis must be placed on increasing the growth speed in order to increase production rates to commercially viable levels.

The growth rate of a dendritic web crystal is determined by the rate that the heat of fusion can be dissipated from the interface between the growing crystal and the liquid meniscus. Heat is typically dissipated up into the cooler web crystal, down into the supercooled region of the melt which is actually colder than the meniscus from which the web grows, and thence, primarily by radiation, to the lip of the susceptor lid and other regions of the growth system. Heat transfer to the lip of the susceptor lid is a critical heat loss path.

It has been established that limitations on growth velocity of dendritic web crystals are associated with the melt temperature, the temperature of the lid covering the melt, and the temperature of the growth slot through which the crystal is pulled. In order to achieve maximum growth rates, it is necessary to provide a relatively hot cover for the melt while also providing a relatively cooler growth slot region, or lip, adjacent to the growing crystal and the liquid meniscus.

One of the problems with prior systems is that the lip region of the lid remains too hot to effectively dissipate the heat of fusion from the web crystal and liquid meniscus regions adjacent to the liquid-solid interface. Prior attempts to cool the lip directly have resulted in cooling the portion of the susceptor lid covering the melt surface, which in turn has caused too much heat to be lost from the surface of the melt, resulting in "ice" formation in the melt, and consequently, unacceptable crystal growth. Similarly, prior heat shields, while maintaining the appropriate heat flow patterns at the melt surface, have not been able to cool the lip portion of the susceptor lid, because such shields are integral with the lip portion of the lid, creating a relatively hot lip.

SUMMARY OF THE INVENTION

The present invention is directed to an apparatus for growing dendritic web crystals at increased growth rates relative to prior systems. The invention achieves these increased growth rates by using a susceptor lid and sublid arrangement, in which the susceptor lid and lip are kept cool by the insulating effect of the sublid, thereby increasing heat transfer from the growing dendritic web to the lip of the susceptor lid, resulting in increased growth rates. Simultaneously, the sublid remains sufficiently hot to prevent the formation of ice discussed earlier.

The present invention solves the problems of prior systems by providing the crystal growth apparatus with a sublid and specially designed lid/lip region. The sublid provides a thermal shield or barrier between the lid and the melt. Heat flow considerations show that this sublid will be hotter than the lid itself and hence hotter than the growth slot. The insulating effect of the sublid is derived both from the thermal insulation of the gas space between the sublid and the main lid and from the radiation shielding action of the sublid. The lip region is stepped downwardly relative to the underside of the lid, providing insulating space between the sublid and the susceptor lid, further assisting in maintaining a cool lip region.

Other details, objects and advantages of the invention will become apparent as the following description of the presently preferred embodiments and presently preferred methods of practicing the invention proceeds.

BRIEF DESCRIPTION OF THE DRAWINGS

In the accompanying drawings, the preferred embodiments of the invention and preferred methods of practicing the invention are illustrated in which.

DETAILED DESCRIPTION OF THE INVENTION

Figure 1:
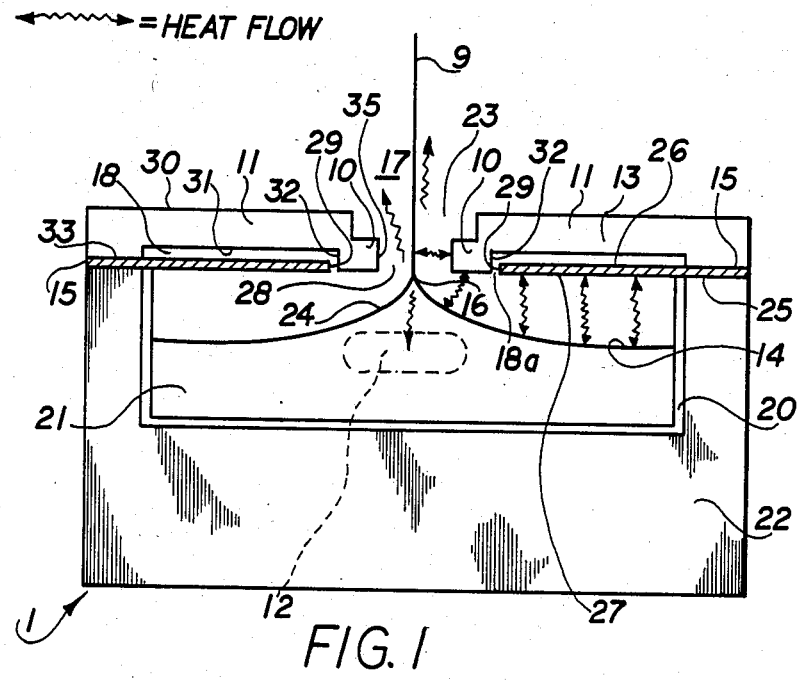
FIG. 1 is an elevation view in section, showing the featurs of the present invention.

FIG. 1 illustrates a preferred embodiment of the present invention. As shown, a dendritic web crystal growing apparatus, generally 1, includes a crucible 20 containing molten silicon 21. The crucible 20 is nested within a susceptor 22. The susceptor 22 includes a susceptor lid 11 having a slot 23. As shown, a dendritic web 9 is pulled through the slot 23 in the susceptor lid, creating a meniscus 24. The dendritic crystal web grows from the interface 16 between the crystal and the meniscus.

The growing apparatus 1 includes a sublid 15, which rests on the top surface 25 of the susceptor 22. The sublid 15 is preferably constructed of molybdenum, and sized and shaped to fit properly over the susceptor. The sublid 15 includes an upper horizontal surface 26 and a lower horizontal surface 27, and a slot 28 defined by an inner vertical surface 29 in the sublid.

The growing apparatus also includes a susceptor lid 11 having an upper horizontal surface 30 and a lower horizontal surface 31. The lid further includes a lip portion 10. This lip portion 10 is stepped downwardly relative to the lower horizontal surface 31 of the susceptor lid 11, forming an outer vertical surface 32, which faces the inner vertical surface 29 of the sublid. The lip 10 also has an inner vertical surface 35, which defines the susceptor lid slot 23. The lip 10 extends around the full perimeter of the susceptor lid slot 23. When positioned, the lip portion 10 of the susceptor lid 11 corresponds with the sublid slot 28, fitting substantially concentrically within the sublid slot 28, permitting the growing web 9 to be pulled up through the susceptor lid slot 23. As shown, the lip portion 10 may extend below the upper horizontal surface 26 of the sublid 15.

As further shown in FIG. 1, the susceptor lid 11 has a spacer flange 33 which permits the lower horizontal surface 31 of the susceptor lid 11 to face the upper horizontal surface 26 of the sublid 15, while maintaining an insulating space 18 therebetween. Alternatively, the spacer flange 33 could be positioned on the sublid 15. Preferably, the insulating space 18 is at least 1 mm between the upper horizontal surface 26 of the sublid and the lower horizontal surface 31 of the susceptor lid and most desirably between 1-2 mm.

The lip portion 10 of the susceptor lid 11 is dimensioned and shaped such that when the susceptor lid is properly positioned an insulating space 18a is maintained between the outer vertical surface 32 of the lip portion 10 and the inner vertical surface 29 of the sublid 15. This insulating space 18a is maintained around the entire periphery of the lip portion 10. Preferably, the insulating space 18a is 1-2 mm, and at least 1 mm between the adjacent surfaces 29 and 32.

The insulating spaces 18 and 18a are typically filled with a gas, generally argon, used in growing dendritic web crystals. However, the insulating space could be filled with an insulating material such as refractory fibers, or other materials known to those skilled in the art.

In operation, the sublid in conjunction with the insulating spaces assist in preventing radiant heat from the melt surface 14 from reaching the portion 13 of the susceptor lid 11 which covers the melt. The sublid and insulating spaces also assist in preventing the convective heat of the susceptor 22 and the heat of the induction heater used to melt the silicon (not shown) from reaching the lip 10. This in turn greatly assists in maintaining a relatively cool lip portion 10, which is preferably 20°-60° C. cooler than the melt temperature. Simultaneously, the sublid allows the surface of the melt 14 to "see" the equivalent of a relatively hot susceptor lid, thereby preventing the formation of "ice" in the melt.

Figure 2:
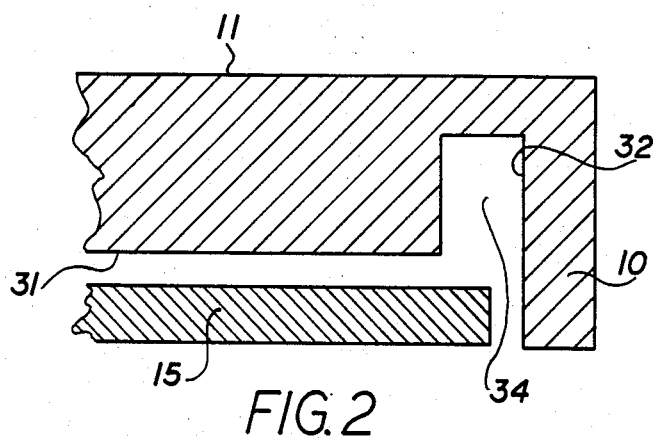
FIG. 2 is an elevation view in section of another preferred embodiment of the present invention.

An alternative preferred embodiment of the present invention is shown in FIG. 2. As shown, the susceptor lid 11 further includes a vertical grooved insulating space 34 which extends upwardly from the lower horizontal surface 31 of the susceptor lid 11 and provides a high resistance path for heat transfer to the lip portion 10. The vertical space 34 preferably has a width of 1-6 mm, and extends the full perimeter of and coaxially with the outer vertical surface 32 of the lip 10. This vertical grooved insulating space 34 can be occupied by the argon gas environment in which dendritic web crystals are grown, or can be filled with an insulating material as noted earlier.

Figure 4:
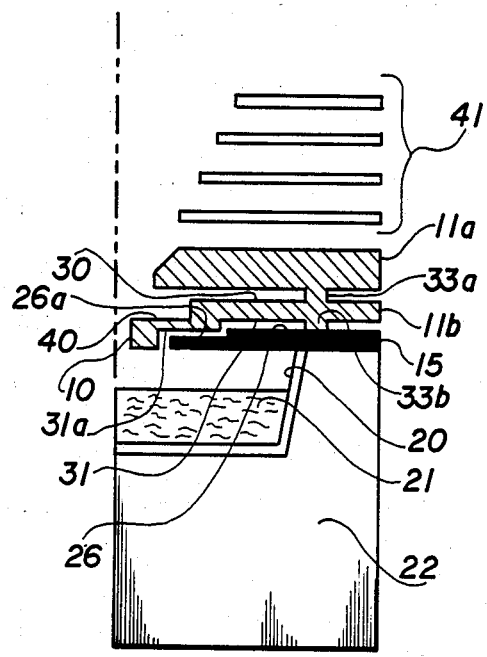
FIG. 4 is a partial sectional view of another preferred embodiment of the present invention.

FIG. 4 illustrates yet another alternative preferred embodiment of the present invention. In this embodiment, the susceptor lid is divided into a top lid 11a and a mid lid 11b. The mid lid includes the lip 10, which is extended outwardly and downwardly from the mid lid 11b by a thin section 40. The mid lid includes both an upper spacer flange 33a and a lower spacer flange 33bb. The lower spacer flange allows the mid lid 11b to rest on the sublid 15 while maintaining an insulating space therebetween as noted previously. The upper spacer flange 33a maintains an insulating space between the top lid 11a and the mid lid 11b and allows the body of the mid lid 11b to maintain a relatively thin profile, which further assists in resisting heat transfer from the heating coil to the lip 10. The thinned section 40 of the mid lid 11b further assists in resisting heat transfer to the lip 10. Also shown in FIG. 4 are heat shields 41, which are placed above the top lid 11a.

The embodiment of FIG. 4 is characterized by an additional stepped-down portion in the mid-lid 11b and the sublid 15, which further assists in maintaining the lip 10 relatively cool. The mid lid 11b has a lower horizontal surface 31 and a most lower horizontal surface 31a stepped downwardly therefrom. The sublid 15 has an upper horizontal surface 26 which faces the sublid surface 31 and a lowered upper horizontal surface 26a stepped downwardly from the upper horizontal surface 26, which faces the most lower horizontal surface 31a of the mid lid 11b. These additional stepped-down surfaces, along with the addition of the thin section 40 to the mid lid 11b, further assist in maintaining a cool lip 10.

Figure 5:
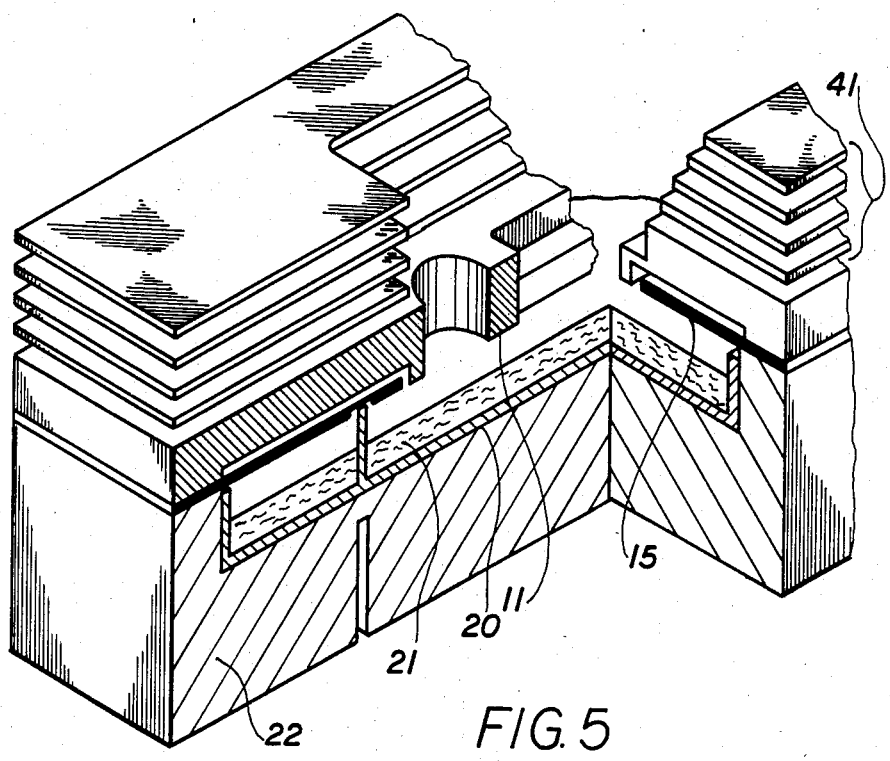
FIG. 5 is an isometric cut-away view of a preferred embodiment of the present invention.

FIG. 5 illustrates a cut-away view of a preferred embodiment of the present invention, demonstrating the positioning of the sublid 15 with respect to the other elements of a dendritic web growth system.

The design parameters of any particular system may make it necessary to be able to modify the lip portion and/or the sublid. Accordingly, it is anticipated that design parameters are to be adjusted by widening or narrowing the thickness of the insulating spaces, the sublid, and the lip portion.

Test Results

Experimental evidence has shown that substantial improvements can be made in growth speed without adversely affecting the thermal stresses in the crystals and present indications are that the sublid concept will permit growth rates in the range required for commercial practicability.

Figure 3:
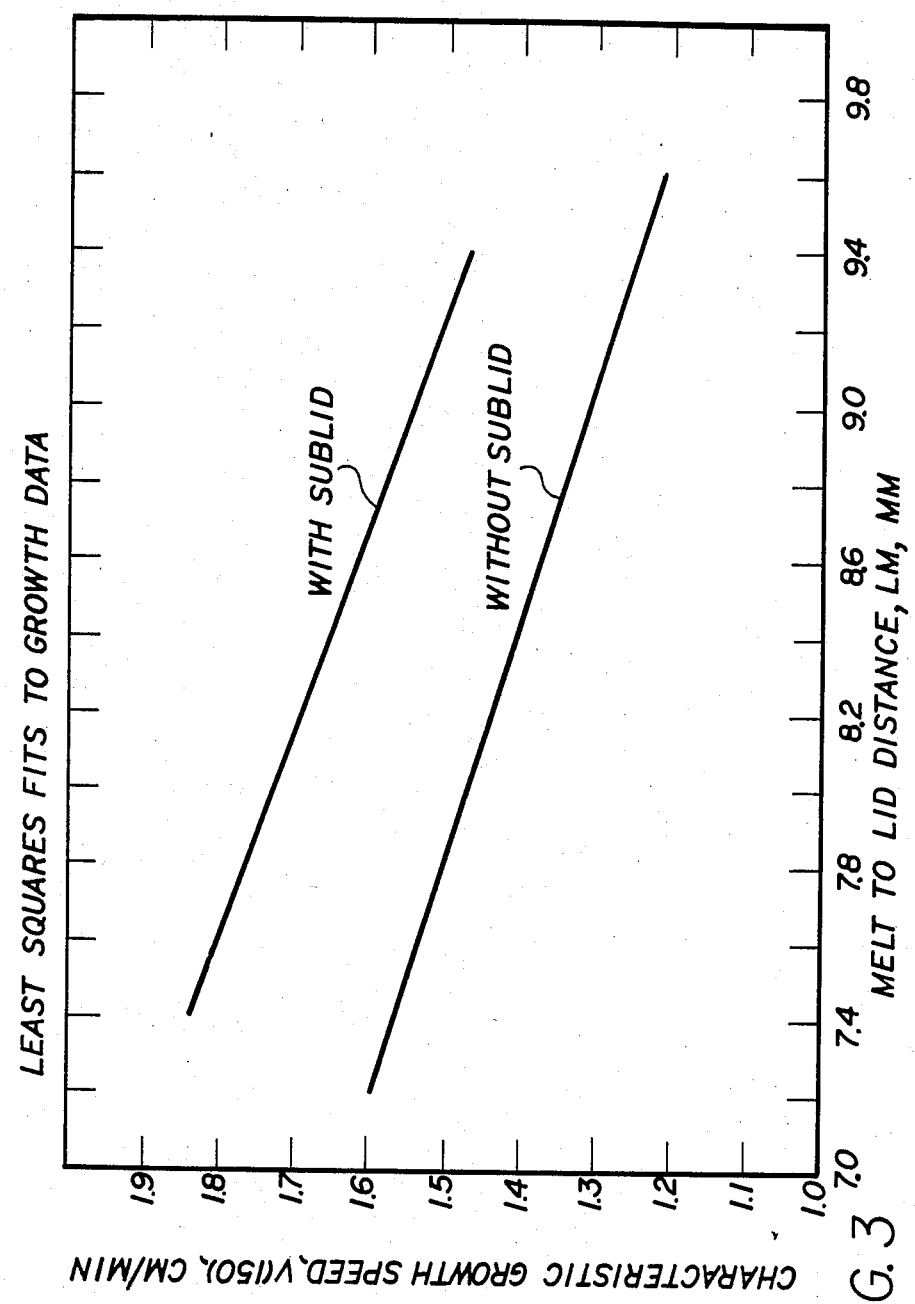
FIG. 3 is a plot demonstrating the improved growth speeds achievable with the present invention.

The effect of the sublid concept upon a dendritic web growth system, as illustrated in FIG. 1, can be seen from FIG. 3 in which are plotted least squares fits to data on characteristic velocity, V(150) as a function of Lm, the separation between the bottom of the lid and the surface of the melt. The optimum value for Lm depends on other characteristics of growth, such as stability against the generation of unwanted extra dendrites. However, the incorporation of the sublid concept provides faster V(150) at whatever Lm is needed.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

I claim:

1. An apparatus for growing dendritic web crystals comprising:
   a. a susceptor;
   b. a crucible for melting silicon, said crucible nesting within said susceptor;
   c. a sublid positioned above said susceptor and crucible, said sublid having upper and lower horizontal surfaces, said sublid further having a slot through which a dendritic web crystal may be pulled, said slot defining at least one inner surface in said sublid;
   d. a susceptor lid having an upper horizontal surface and a lower horizontal surface, said susceptor lid further having a slot through which a dendritic web crystal may be pulled, said susceptor lid further having a lip disposed downwardly from said susceptor lid lower horizontal surface, said lip extending continuously and peripherally around said susceptor lid slot and having an outer surface facing the inner surface of said sublid, said susceptor lid lower horizontal surface facing said sublid upper horizontal surface;
   e. said susceptor lid being positioned above said sublid such that the lip of said susceptor lid fits substantially concentrically within said sublid slot, and providing insulating space between the upper horizontal surface of said sublid and the lower horizontal surface of said susceptor lid and between the outer surface of said susceptor lid lip and the inner surface of said sublid.

2. The apparatus of claim 1 in which the insulating space between said lower horizontal susceptor lid surface and said upper horizontal sublid surface and between said inner sublid surface and said outer lip surface is at least 1 millimeter.

3. The apparatus of claim 2 in which said insulating space is 1 to 2 millimeters.

4. The apparatus of claim 1 in which the insulating space is occupied by an inert insulating gas, said gas being that used for growing dendritic web crystals.

5. The apparatus of claim 4 wherein said gas is argon.

6. The apparatus of claim 1 in which the insulating space is occupied primarily by a non-gaseous insulating material.

7. The apparatus of claim 6 wherein said non-gaseous insulating material is refractory fiber.

8. The apparatus of claim 1 in which the susceptor lid comprises a top lid and a mid lid, the top lid being positioned above the mid lid, said mid lid having a thin section connecting said lip to said mid lid, said mid lid further having an upper spacer flange separating said top lid from said mid lid such that there remains a first insulating space therebetween, said mid lid further having a lower spacer flange, said lower spacer flange allowing said mid lid to rest on said sublid while maintaining a second insulating space between said mid lid and said sublid.

9. The apparatus of claim 8 wherein said mid lid has a lower horizontal surface and a lowest horizontal surface stepped downwardly therefrom, and said sublid has an upper horizontal surface facing said lower horizontal surface of said mid lid, said sublid further having a lowered horizontal surface stepped downwardly from said upper horizontal surface, said lowered horizontal surface facing said lowest horizontal surface of said mid lid.

10. The apparatus of claim 1 wherein said insulating space is at least 1 millimeter between said sublid upper horizontal surface and said susceptor lid lower horizontal surface and at least 1 millimeter between said lip outer surface and said sublid inner surface.

11. The apparatus of claim 1 in which the susceptor lid further includes a vertical grooved insulating space extending upwardly from the lower horizontal surface of said susceptor lid and peripherally and immediately adjacent the outer surface of said lip.

12. The apparatus of claim 11 wherein said vertical grooved insulating space has a width of 1-6 millimeters.

13. The apparatus of claim 11 wherein the insulating space between said lower horizontal susceptor lid surface and said upper horizontal sublid surface and between said inner sublid surface and said outer lip surface is at least 1 millimeter.

14. The apparatus of claim 11 wherein said insulating space between said lower horizontal susceptor lid surface and said upper horizontal sublid surface and between said inner sublid surface and said outer lip surface is 1 to 2 millimeters.

15. The apparatus of claim 11 wherein the vertical grooved insulating space and the insulating space between said lower horizontal susceptor lid surface and said upper horizontal sublid surface and between said inner vertical sublid surface and said outer vertical lip surface is occupied by an inert insulating gas, said gas being that used for growing dendritic web crystals.

16. The apparatus of claim 11 wherein the vertical grooved insulating space and the insulating space between said lower horizontal susceptor lid surface and said upper horizontal sublid surface and between said inner sublid surface and said outer lip surface is occupied primarily by a non-gaseous insulating material.

17. The apparatus of claim 16 wherein said non-gaseous insulating material is refractory fiber.

* * * * *